US006737886B2

(12) United States Patent
Curatolo et al.

(10) Patent No.: US 6,737,886 B2
(45) Date of Patent: May 18, 2004

(54) LOW-NOISE OUTPUT BUFFER

(75) Inventors: Giacomo Curatolo, Palermo (IT);
Ignazio Martines, Aci Cestello (IT);
Davide Torrisi, Adireale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/282,487

(22) Filed: Oct. 28, 2002

(65) Prior Publication Data

US 2003/0080781 A1 May 1, 2003

(51) Int. Cl.[7] .............................................. H03K 17/16
(52) U.S. Cl. ............................ 326/83; 326/87; 326/27
(58) Field of Search ......................... 326/82, 83, 86, 326/87, 26, 27

(56) References Cited

U.S. PATENT DOCUMENTS

| | | | |
|---|---|---|---|
| 4,739,193 A | | 4/1988 | Doty, II |
| 4,829,199 A | * | 5/1989 | Prater .......................... 326/27 |
| 5,233,238 A | * | 8/1993 | Mattos ......................... 326/27 |
| 5,568,062 A | | 10/1996 | Kaplinsky |
| 5,801,550 A | | 9/1998 | Tanaka et al. |
| 5,877,647 A | * | 3/1999 | Vajapey et al. ............. 327/391 |
| 5,966,042 A | | 10/1999 | Werner et al. |
| 6,091,260 A | * | 7/2000 | Shamarao .................... 326/27 |
| 6,097,237 A | * | 8/2000 | Singh .......................... 327/389 |

FOREIGN PATENT DOCUMENTS

JP   07226659   8/1995

OTHER PUBLICATIONS

European Search Report dated Feb. 25, 2002 for European Application No. 01830675.

* cited by examiner

Primary Examiner—Don P Le
(74) Attorney, Agent, or Firm—Lisa K. Jorgenson; Jon A. Gibbons; Fleit, Kain, Gibbons, Gutman, Bongini & Blanco P.L.

(57) ABSTRACT

An output buffer for causing a voltage (Vout) of an integrated circuit output line (OUT,OUT_PAD) to switch from a voltage of a first voltage line (VDD) to a voltage of a second voltage line (GND) and vice versa, comprises a current path switch circuit (111a,111b) activatable for causing a prescribed current (Is) to constantly flow between the first and second voltage lines during a time between two successive switchings of the output line, and for causing the prescribed current to be deviated (Ic1) to the output line during at least an initial phase of an output line switching from the first voltage line voltage to the second voltage line voltage or vice versa. A current delivered by the first and second voltage lines is thus kept substantially constant in the output line switching. In this way, the time derivative of the current flowing between the first and the second voltage lines is kept small and low switching noise is induced.

20 Claims, 7 Drawing Sheets

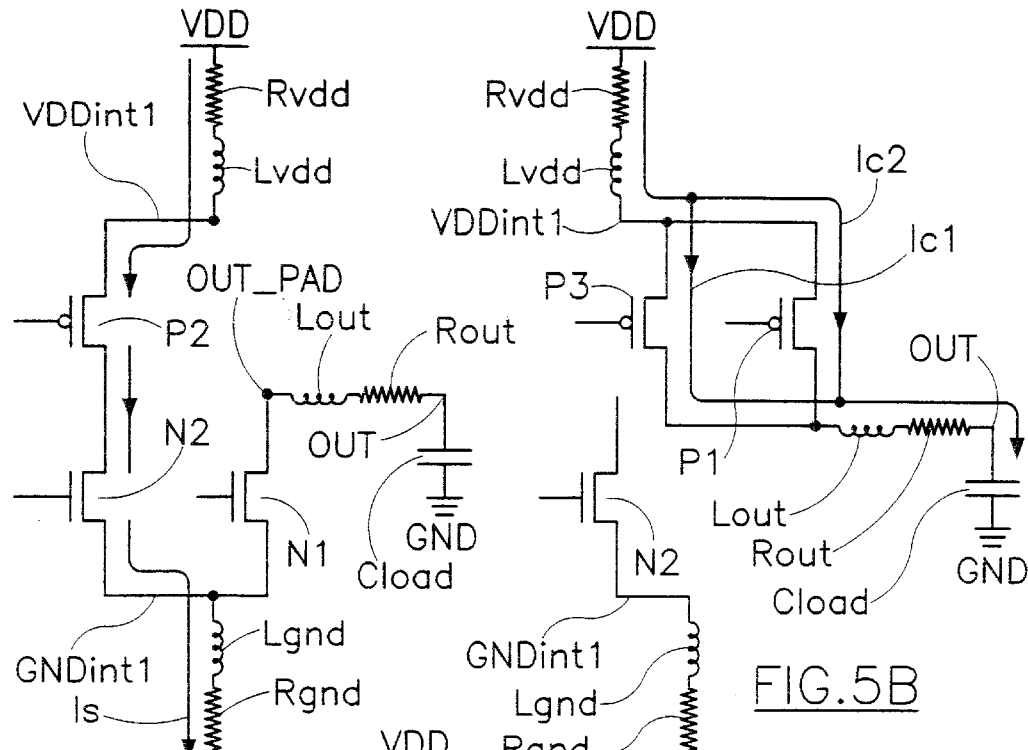
FIG.5A
FIG.5B
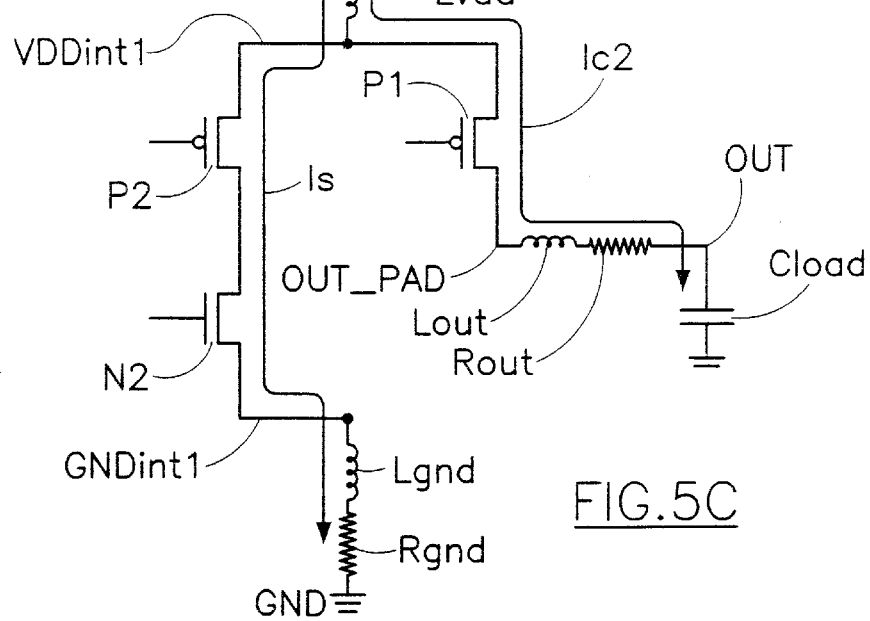
FIG.5C

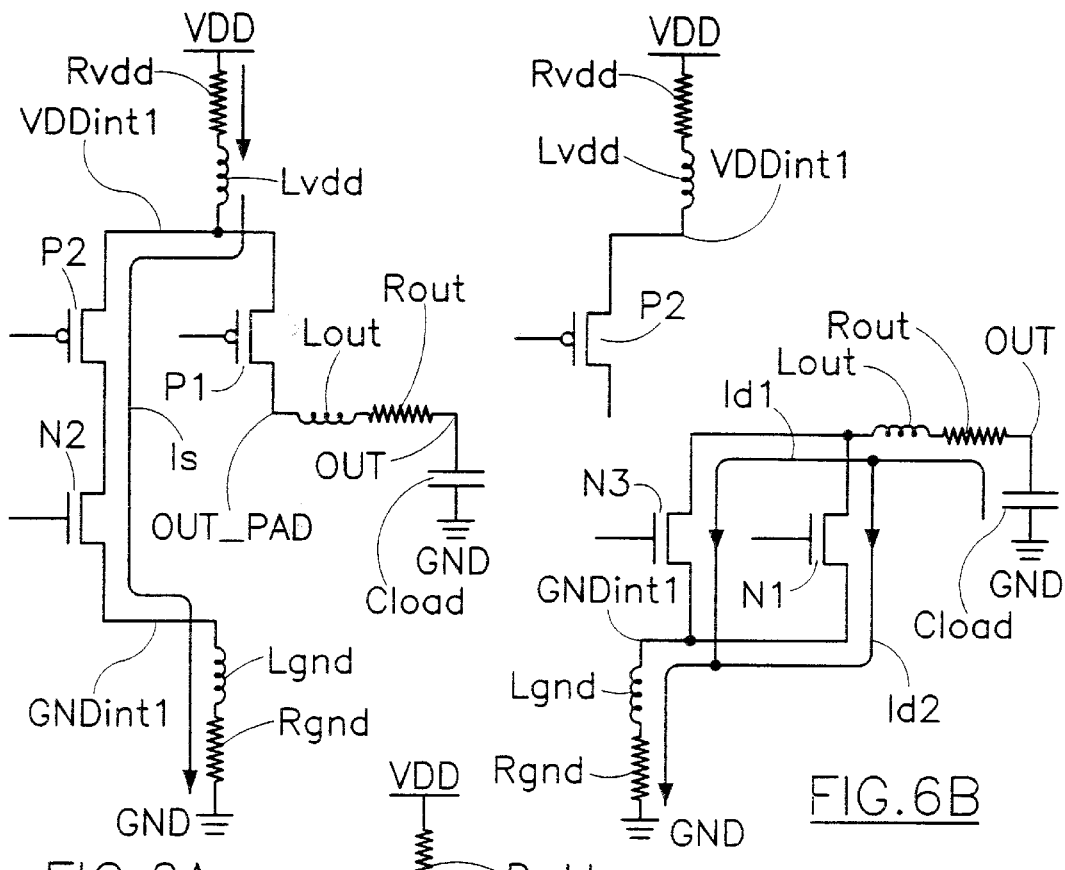
FIG.6A
FIG.6B
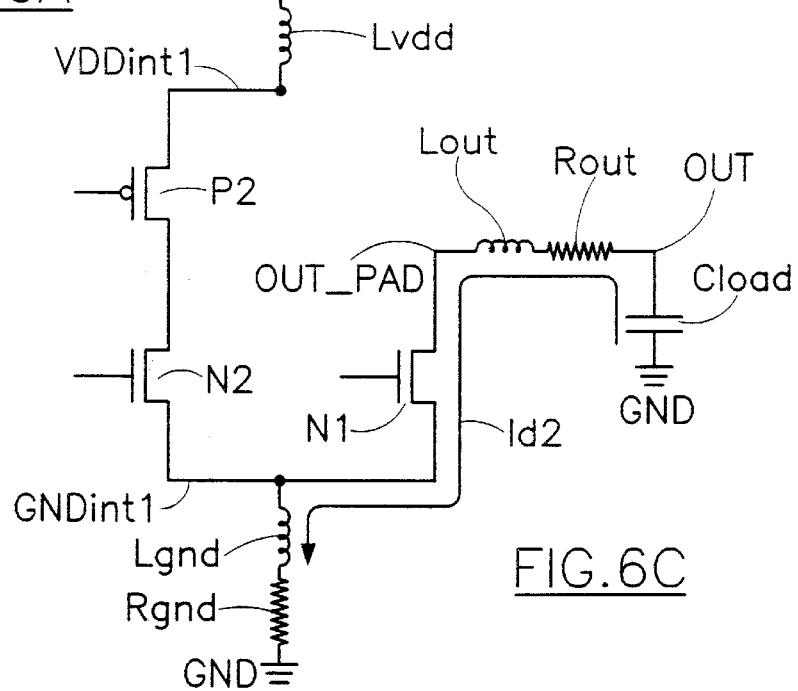
FIG.6C

LOW-NOISE OUTPUT BUFFER

CROSS REFERENCE TO RELATED APPLICATIONS

This application is based upon and claims priority from prior European Patent Application No. 01830675.3, filed Oct. 29, 2001, the disclosure of which is hereby incorporated by reference in its entirety.

BACKGROUND OF THE INVENTION

1. Field of the Invention

The present invention generally relates to the field of integrated circuits, and more specifically to an output buffer.

2. Description of Related Art

Output buffers are used in integrated circuits ("ICs" in the following) for driving signal lines connected to the signal outputs of the IC. For example, in semiconductor memory ICs output buffers are associated with the data outputs and are used to drive data bus lines external to the memory.

As known from the technical literature, to a first approximation the signal line can represented in a schematic by a capacitive load for the IC signal output. The amount of the capacitive load depends on the parasitic capacitance associated with the signal line connecting the IC signal output to signal inputs of different ICs and on the fan-out of the signal output (i.e., the number of such signal inputs).

The requirements in terms of driving capability of the output buffers are in general rather severe. For example, an output buffer of a Flash memory IC must be capable of driving loads of 30 pF or more. This has a significant impact on the operating speed of the output buffer.

In the past, the operating speed of the output buffers was not a major concern, at least as far as Flash memory ICs were considered. Operating frequencies of the order of 50 MHz were considered sufficient, so that the relatively low speed of the output buffer had not a great impact.

Nowadays, with the enormous performance increase of microprocessors, the operating speed requirements for the memory ICs have consequently become more demanding. Manufacturers have thus started to offer memories operating at 100–150 MHz.

In view of this, the relatively low speed of the output buffers represents now one of the bottlenecks in achieving higher IC speeds, in particular for Flash memory ICs.

In order to increase the speed of the output buffer, the output buffer must be capable of delivering (i.e., supplying or sinking) a relatively large current in a short time. Relatively high current time derivatives are thus involved.

To study the behaviour of the output buffer, a correct electrical model of the IC package is adopted. In general, each contact pad of the IC, be it a signal input or output contact pad or a voltage supply contact pad (VDD or GND), is connected through a bonding wire to a package lead, terminating with a pin for the electrical and mechanical connection to a conductive track of a printed circuit board (PCB). Taking into account the parasitic components and adopting a lump-parameter model, conventionally called "reverse Γ" model, each voltage supply input of the IC can be schematised as connected to the respective voltage supply track of the PCB through the series of a resistor and an inductor; the capacitance present in the reverse Γ model can be neglected, since the potential of the supply voltage tracks can be assumed to be time-invariable. Similarly, each signal output can be schematised as connected to a capacitive load through the series of a resistance and an inductor; in this case, the capacitance present in the reverse Γ model simply adds up to the capacitive load. The parasitic resistor, normally of quite small resistance, causes a small voltage drop, which is proportional to the current circulating through it. However, when the current time derivatives become significant, the skin effect can cause an increase of the parasitic resistance, with the consequence of slowing down the transitions between logic states and inducing noise on the effective supply voltages at the IC contact pads. More problems come however from the parasitic inductor, which introduces a voltage drop directly proportional to the time derivative of the current flowing through it. This slows down the transitions between logic states and causes irradiation of noise throughout the circuitry due to cross-talks. In the worst case, logic errors can be induced such as, in a memory IC, the start of a spurious read operation. This kind of noise is the most feared, because it increases with the increase of the output buffer speed.

The solutions proposed in the art to the above-discussed problem are of two kinds.

According to a first solution, the output buffer, in principle an inverter, is made up of a plurality of parallel-connected pull-up and pull-down transistors of relatively small resistance. When the output buffer has to switch the associated output line from one logic state to the other, the transistors are selectively turned on according to a prescribed timing. In this way, the maximum current that can be delivered by the output buffer is equal to that deliverable by an output buffer having only one pull-up and one pull-down transistor of large resistance, but the current time derivative can be kept sufficiently small.

A second solution provides for slowing down the pull-up and pull-down transistors turning on, so as to limit the current time derivative.

This two solutions are normally encountered in every output buffer, either alone or combined together and possibly in combination with further techniques for a feed-back or adaptive control of other conditions such as process variations, temperature and so on.

Although the solutions outlined above are useful, they have however proved not sufficient to solve the problem of the output buffer-induced switching noise. A further measure adopted by almost all the manufacturers of ICs consists in splitting the voltage supplies for the output buffers from those for the remaining circuitry of the IC. By way of example, memory devices are commercially available in which dedicated voltage supply contact pads (VDD and GND) are provided every two output buffers.

This solution, albeit rather drastic in reducing the switching noise problem, has the disadvantage of causing a substantial increase in the IC chip size, and thus of production costs, because each contact pad occupies a significant area. Additionally, dedicated packages must be designed, having a higher number of pins than standard ones. Apart from the intrinsic higher costs of a dedicated package compared to a standard one, the end users have to redesign the PCBs on which the ICs are to be mounted.

SUMMARY OF THE INVENTION

The present invention provides an output buffer capable of reaching high operating speeds, featuring a low noise and not affected by the drawbacks of the known output buffers. An output buffer according to one aspect of the present invention comprises a current path switch circuit activatable for causing a prescribed current to constantly flow between a first voltage line and a second voltage line during a time between two successive switchings of the output line, and for causing the prescribed current to be deviated to the output line during at least an initial phase of an output line switching from the first voltage line voltage to the second voltage line voltage or vice versa. A current delivered by that voltage line, between the first and second voltage lines, which plays an active role in the output line switching is thus kept substantially constant.

In this way, when the output line voltage must be switched from the voltage of the first voltage line to the voltage of the second voltage line, or vice versa, the time derivative of the current flowing between the first and second voltage lines is kept small. The switching noise caused by the presence of parasitic components such as inductances associated with the bonding wire and the package lead is minimized.

BRIEF DESCRIPTION OF THE DRAWINGS

The subject matter which is regarded as the invention is particularly pointed out and distinctly claimed in the claims at the conclusion of the specification. The foregoing and other features and advantages of the present invention will be made apparent by the following detailed description of one embodiment thereof, provided merely by way of a non-limitative example, which will be made with reference to the attached drawings, wherein:

FIGS. 5A, 5B and 5C show the evolution of the output buffer of FIGS. 1 and 2 during a transition of the output buffer output signal from a first logic state to a second logic state; and FIGS. 6A, 6B and 6C show the evolution of the output buffer of FIGS. 1 and 2 during a transition of the output buffer output signal from the second logic state to the first logic state.

DETAILED DESCRIPTION OF AN EMBODIMENT

Figure 1:
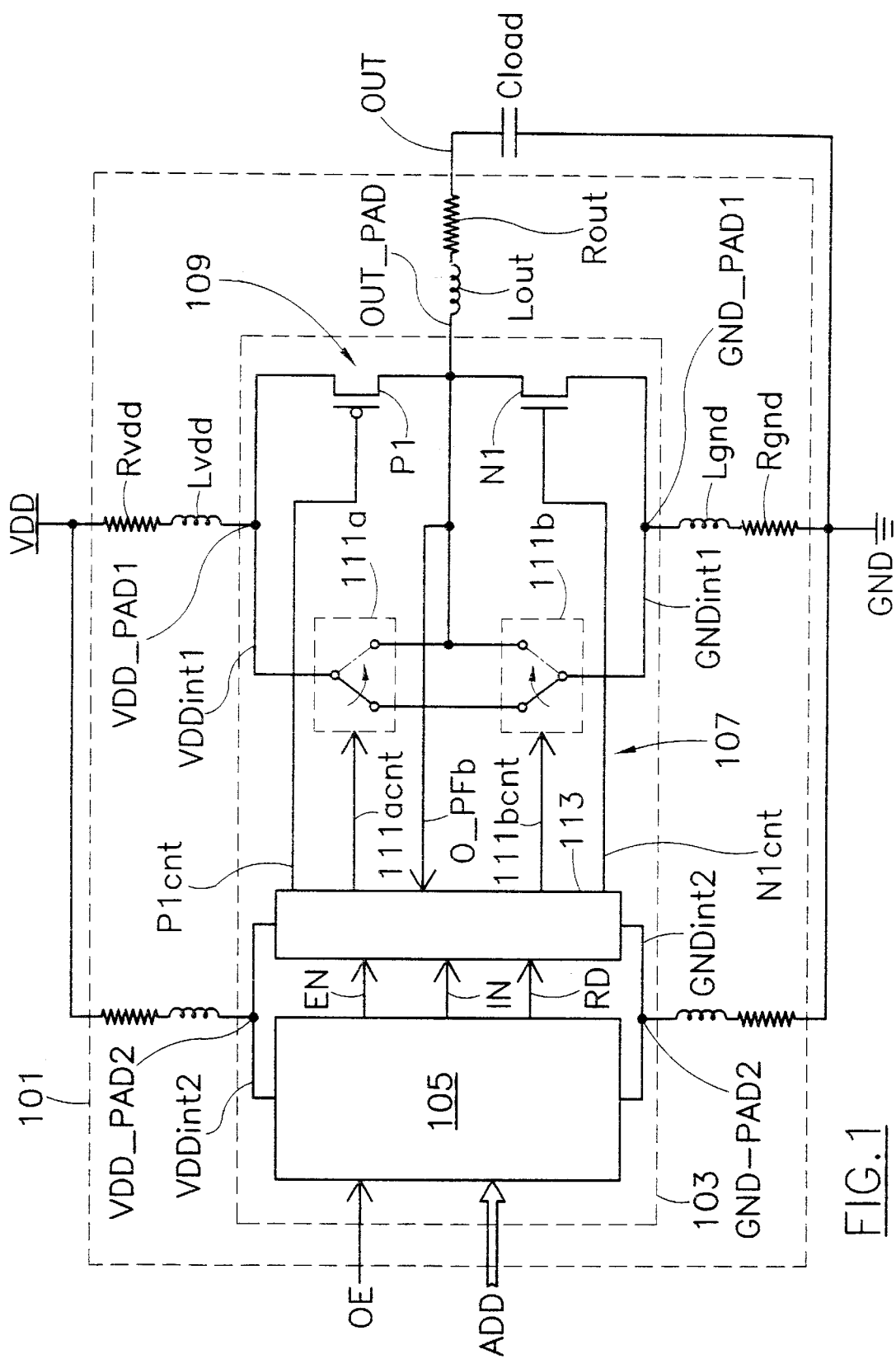
FIG. 1 shows schematically an integrated circuit including an output buffer in accordance with an embodiment of the present invention, evidencing parasitic components associated with voltage supply inputs and signal outputs of the integrated circuit.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality. In the drawing like numerals refer to like parts through several views.

With reference to the drawings, reference numeral 101 in FIG. 1 identifies a chip of a generic integrated circuit (IC) 103 housed in a respective package. The IC 103 is shown in an extremely simplified way but, for the purpose of describing the embodiment of the present invention, it suffices to think of the IC 103 as comprising generically a circuitry 105, generating a signal IN which, through an output buffer 107, is to be made available at an output signal terminal or pin OUT of the package. For example, supposing that the IC 103 is a memory device, the signal IN is the result of a read operation of a memory location identified by address signals ADD fed to the integrated circuit 103. As discussed in the introduction of the present specification, the output signal pin OUT is conventionally connected to a corresponding output signal contact pad OUT_PAD of the IC chip through a bonding wire, bonded at a first end to the output signal contact pad OUT_PAD and at a second end to a package lead, terminating with the pin. In the drawing, the bonding wire, the package lead and the pin are not shown pictorially, but simply by means of a lump-parameter electrical model (the so-called reverse $\Gamma$ model) comprising an inductor Lout and a resistor Rout connected in series between the output signal contact pad OUT_PAD of the IC and the output signal pin OUT of the package. The inductor Lout and the resistor Rout represent the parasitic inductance and, respectively, the parasitic resistance associated with the bonding wire and the package lead. A capacitor Cload connected to the output signal pin OUT is a lump-parameter electrical model of the load introduced by signal inputs of other ICs (not shown), which are driven by the signal provided by the IC 103 at the output signal pin OUT. The load capacitor Cload is also intended to include the capacitance present in the reverse $\Gamma$ model of the parasitic components.

The output buffer 107 comprises a final driver 109, which in the embodiment of the invention here described has the structure of a CMOS inverter, with a P-Docket channel MOSFET P1, the pull-up element of the inverter, connected in series to an N-channel MOSFET N1, the pull-down element of the inverter. The P-channel MOSFET P1 and the N-channel MOSFET N1 of the final driver 109 are inserted between an internal supply voltage line VDDint1 and an internal reference voltage line GNDint1. The internal supply voltage line VDDint1 and the internal reference voltage line GNDint1 depart from a supply voltage contact pad VDD_PAD1 and, respectively, a reference voltage contact pad GND_PAD1 of the IC chip 103, each of which is connected to an external supply voltage VDD and, respectively, an external reference voltage GND through a bonding wire, a package lead and a pin. As for the output signal contact pad OUT_PAD, the bonding wire, the package lead and the pin are not shown pictorially, but simply by means of a lump-parameter electrical model comprising an inductor Lvdd, Lgnd and a resistor Rvdd, Rgnd connected in series between the respective contact pad VDD_PAD1, GND_PAD1 of the IC and the external supply voltage VDD and, respectively, the external reference voltage GND. The inductors Lvdd, Lgnd and the resistors Rout, Rgnd represent the parasitic inductance and, respectively, the parasitic resistance associated with the bonding wires and the package leads.

The supply voltage contact pad VDD_PAD1 and the reference voltage contact pad GND_PAD1 can be unique for the whole IC 103. Alternatively, and preferably, the supply voltage contact pad VDD_PAD1 and the reference voltage contact pad GND_PAD1 are dedicated to providing a voltage supply to the output buffer 107, separate supply voltage contact pad VDD_PAD2 and reference voltage contact pad GND_PAD2 being provided in the IC 103 for providing the supply and reference voltages VDD and GND to the remaining (i.e., the circuitry 105) of the IC 103 through internal supply and reference voltage lines VDD_int2 and GND_int2 distinct from the internal supply and reference voltage lines VDDint1 and GNDint1. This ensures a better immunity of the IC 103 to the switching noise produced by the output buffer. If, as it normally is, the IC 103 has more than one output signal contact pad and thus more than one output buffer, the supply voltage contact pad VDD_PAD1 and the reference voltage contact pad GND_PAD1 can supply all of the output buffers (the internal supply voltage line VDDint1 and the internal reference voltage line GNDint1 being in this case common to all the output buffers). Alternatively, distinct supply voltage contact pads VDD_PAD1 and reference voltage contact pads GND_PAD1 can be provided for supplying the supply and reference voltages VDD and GND to groups of output buffers. This last solution, providing a very high immunity of the IC to the output buffers switching noise, is however space-consuming due to the high number of contact pads, as discussed in the introduction of the present specification.

In addition to the final driver 109, the output buffer 107 comprises a first and a second current switch circuits 111a, 111b connected between the internal supply voltage line VDDint1 and the internal reference voltage line GNDint1. The first current switch circuit 111a, having an input connected to the internal supply voltage line VDDint1, can be switched between a first condition in which it directs a current sunk from the internal supply voltage line VDDint1 towards the second current switch circuit 111b, and a second condition in which the current is instead directed to the output signal contact pad OUT_PAD. The second current switch circuit 111b, having an output connected to the internal reference voltage line GNDint1, can be switched between a first condition in which it is connected in series to the first current switch circuit 111a, so as to receive the current therefrom when the first current switch circuit is in the first condition, and a second condition in which a current can instead be received from the output signal contact pad OUT_PAD.

The final driver 109 and the two current switch circuits 111a, 111b are controlled by a control circuit 113. Preferably, for immunity to the switching noise produced by the output buffer, the control circuit 113 receives the supply and reference voltages from the internal supply and reference voltage lines VDDint2 and GNDint2. The control circuit 113 operates on the basis of the signal IN produced by the IC circuitry 105, as well as on the basis of control signals EN and RD received from the IC circuitry 105. The control signal EN is an output buffer enable signal: this signal informs the control circuit 113 on whether the output buffer 107 has to be put in an inactive, or high-impedance, condition or has to be activated for driving the output signal pin OUT. The control signal EN can be thought as derived from an external output enable signal OE, fed to the integrated circuit 103. The function of the control signal RD, as will be explained in greater detail later on, is to enable/disable the activation of the current switch circuits, for cutting off the static current consumption.

In particular, on the basis of the signals IN, EN and RD, the control circuit 113 generates respective control signals P1cnt and N1cnt for controlling the P-channel MOSFET P1 and the N-channel MOSFET N1 of the final driver 109, and respective control signals 111acnt and 111bcnt for controlling the first and second current switch circuits 111a and 111b. The control circuit 113 also receives a feedback control signal O_Pfb from the output signal contact pad OUT_PAD. As will be better explained later on in this description, the feedback control signal O_Pfb conditions in particular the generation of the control signals 111acnt and 111bcnt of the first and second current switch circuits 111a and 111b.

Figure 2:
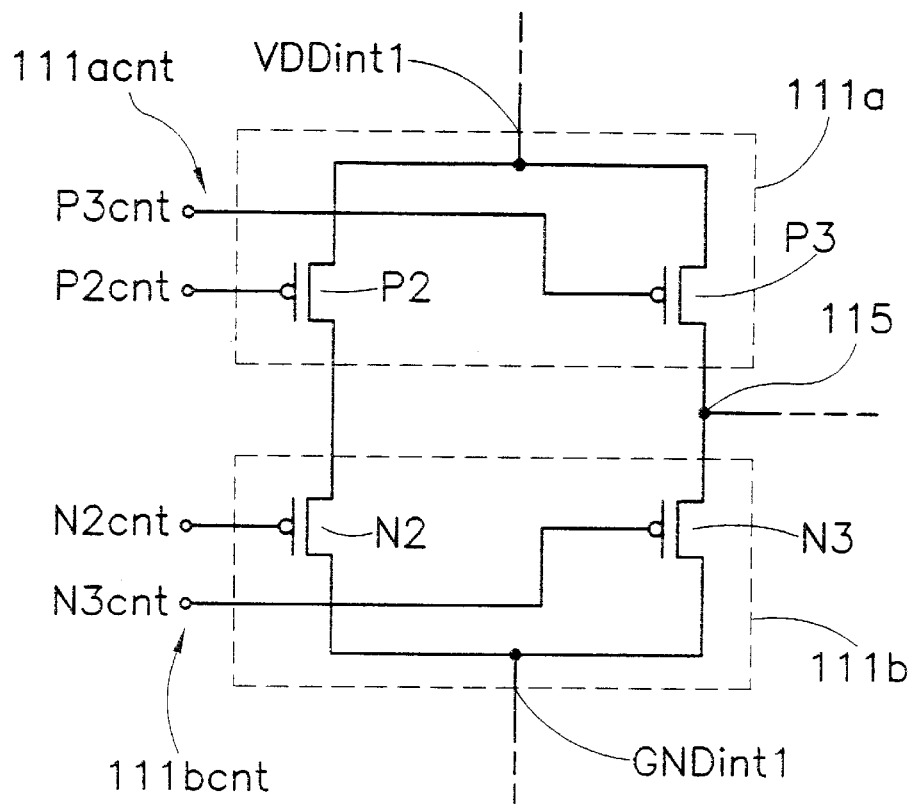
FIG. 2 is a circuit diagram of a possible embodiment of current switch circuits of the output buffer shown in FIG. 1.

Referring now to FIG. 2, a possible practical implementation of the first and second current switch circuits 111a and 111b is shown. The first current switch circuit 111a comprises a first P-channel MOSFET P2 and a second P-channel MOSFET P3. Similarly, the second current switch circuit 111b comprises a first N-channel MOSFET N2 and a second N-channel MOSFET N3. The first P-channel MOSFET P2 of the first current switch circuit 111a has a source connected to the internal supply voltage line VDDint1, a drain connected to a drain of the first N-channel MOSFET N2 of the second current switch circuit 111b, and a gate controlled by a control signal P2cnt supplied by the control circuit 113. The first N-channel MOSFET N2 of the second current switch circuit 111b has a source connected to the internal reference voltage line GNDint1 and a gate controlled by a control signal N2cnt generated by the control circuit 113. The second P-channel MOSFET P3 of the first current switch circuit 111a has a source connected to the internal supply voltage line VDDint1, a drain connected to a circuit node 115 connected to the output signal contact pad OUT_PAD and a gate controlled by a control signal P3cnt. The control signals P2cnt and P3cnt of the first and second P-channel MOSFETs P2 and P3 of the first current switch circuit 111a form the control signal 111acnt shown in FIG. 1. The second N-channel MOSFET N3 of the second current switch circuit 111b has a drain connected to the circuit node 115, a source connected to the internal reference voltage line GNDint1 and a gate controlled by a control signal N3cnt. The control signals N2cnt and N3cnt of the first and second N-channel MOSFETs N2 and N3 of the second current switch circuit 111b form the control signal 111bcnt shown in FIG. 1.

Figure 3B:
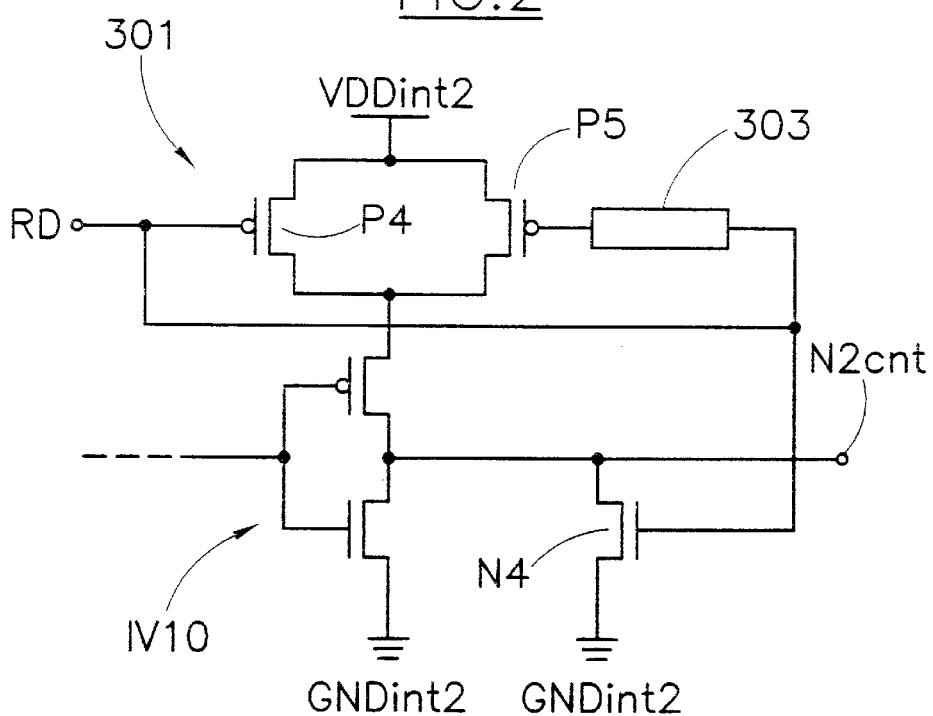
FIGS. 3A and 3B are circuit diagrams (mainly at the logic gates level) of a control circuit of the output buffer shown in FIG. 1.
Figure 3A:
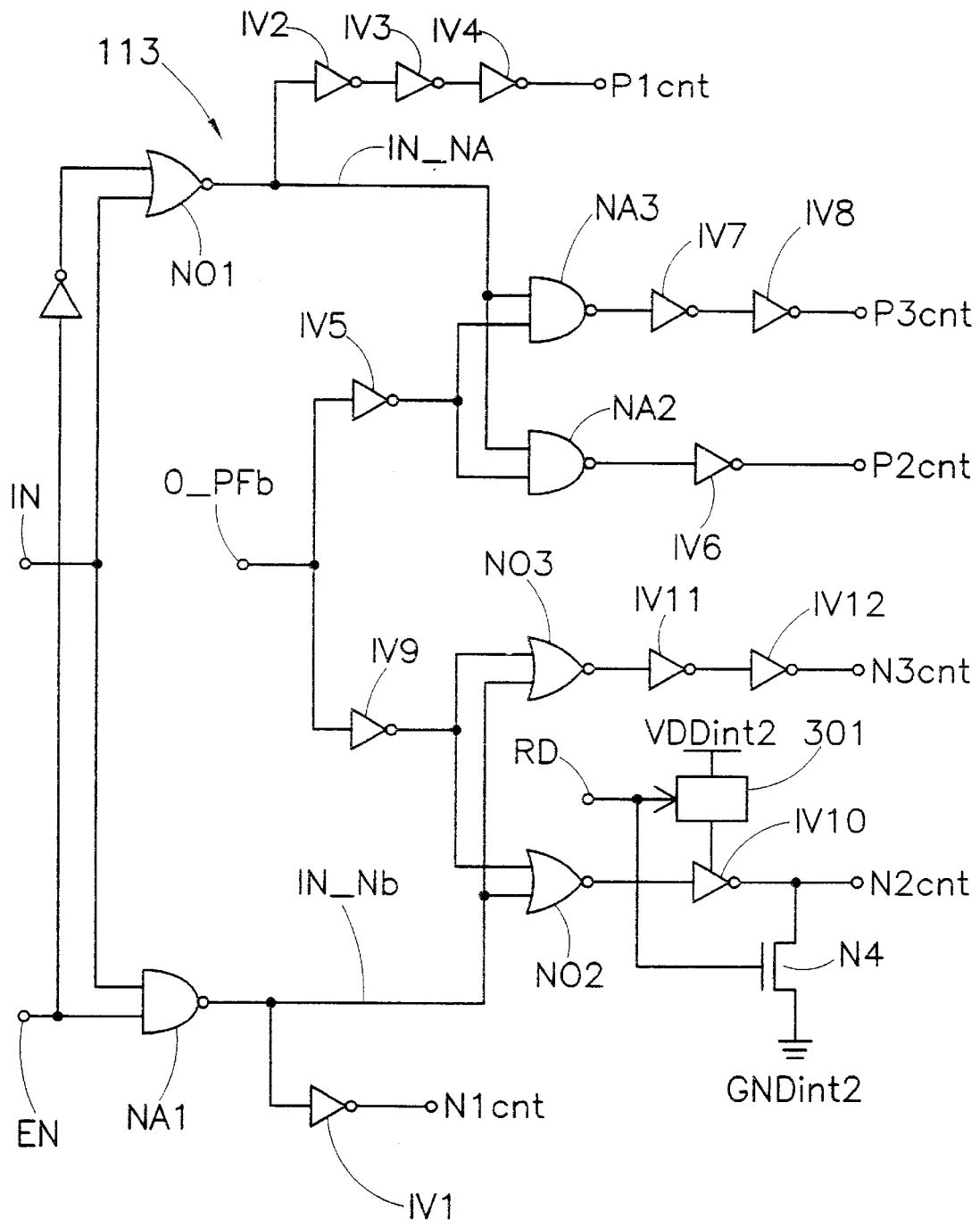

FIGS. 3A and 3B show a possible practical implementation of the control circuit 113. The signal IN coming from the circuitry 105 of the IC is supplied in parallel to a first input of a NOR logic gate NO1 and to a first input of a NAND logic gate NA1. A second input of the NAND gate NA1 is fed with the output buffer enable signal EN, and a second input of the NOR gate NO1 is fed with a logic complement of the output buffer enable signal EN. An output signal IN_Nb of the first NAND gate NA1 is supplied to an inverter IV1; an output signal of the inverter IV1 forms the control signal N1cnt for the pull-down transistor N1 of the final driver 109. An output signal IN_Na of the first NOR gate NO1 is supplied to three cascaded inverters IV2, IV3, IV4; an output signal of the last inverter IV4 of the three cascaded inverters forms the control signal P1cnt for the pull-up transistor P1 of the final driver 109.

The output signal IN_Na of the first NOR gate NO1 is also supplied in parallel to respective first inputs of a second and a third NAND logic gates NA2, NA3. Respective second inputs of the second and third NAND gates NA2 and NA3 receives, through an inverter IV5, an inverted version of the feedback control signal O_Pfb. The control signal P2cnt for the first P-channel MOSFET P2 of the first current switch circuit 111a is derived from an output signal of the NAND gate NA2 through an inverter IV6. The control signal P3cnt for the second P-channel MOSFET P3 of the first current switch circuit 111a is derived from an output signal of the NAND gate NA2 through two cascaded inverters IV7 and IV8.

In a similar manner, the output signal IN_Nb of the first NAND gate NA1 is also supplied in parallel to respective first inputs of a second and a third NOR logic gates NO2, NO3. Respective second inputs of the second and third NOR gates NO2 and NO3 receives, through an inverter IV9, an inverted version of the feedback control signal O_Pfb. The control signal N2cnt for the first N-channel MOSFET N2 of the second current switch 111b is derived from an output signal of the NOR gate NO2 through an inverter IV10. A circuit block 301 controlled by the control signal RD is provided for selectively enabling or disabling the inverter IV10, and a clamp element, for example an N-channel MOSFET N4, ensures that the control signal N2cnt is tied to the internal reference voltage line GNDint2 when the inverter IV10 is disabled. The control signal N3cnt for the second N-channel MOSFET N3 of the second current switch 111b is derived from an output signal of the NOR gate NO2 through two cascaded inverters IV11 and IV12.

Preferably, all the logic gates and the inverters of FIG. 3A belong to the CMOS family.

The inverter IV1 is preferably dimensioned so that the "1"→"0" transition of the control signal N1cnt is relatively fast, while the opposite, "0"→"1" transition is relatively slow. Dually, the three cascaded inverters are preferably dimensioned in such a way as to make the "0"→"1" transition of the control signal P1cnt relatively fast, while the "1"→"0" transition is relatively slow.

FIG. 3B shows a possible practical implementation of the circuit block 301 of FIG. 3A. The inverter IV10 is connected to the internal supply voltage line VDDint2 through two parallel-connected P-channel MOSFETs P4 and P5. The P-channel MOSFET P4, which is made less conductive than the P-channel MOSFET P5, has a gate connected directly to the control signal RD. A gate of the P-channel MOSFET P5 is instead connected to the control signal RD through a delay line 303.

Figure 4A:
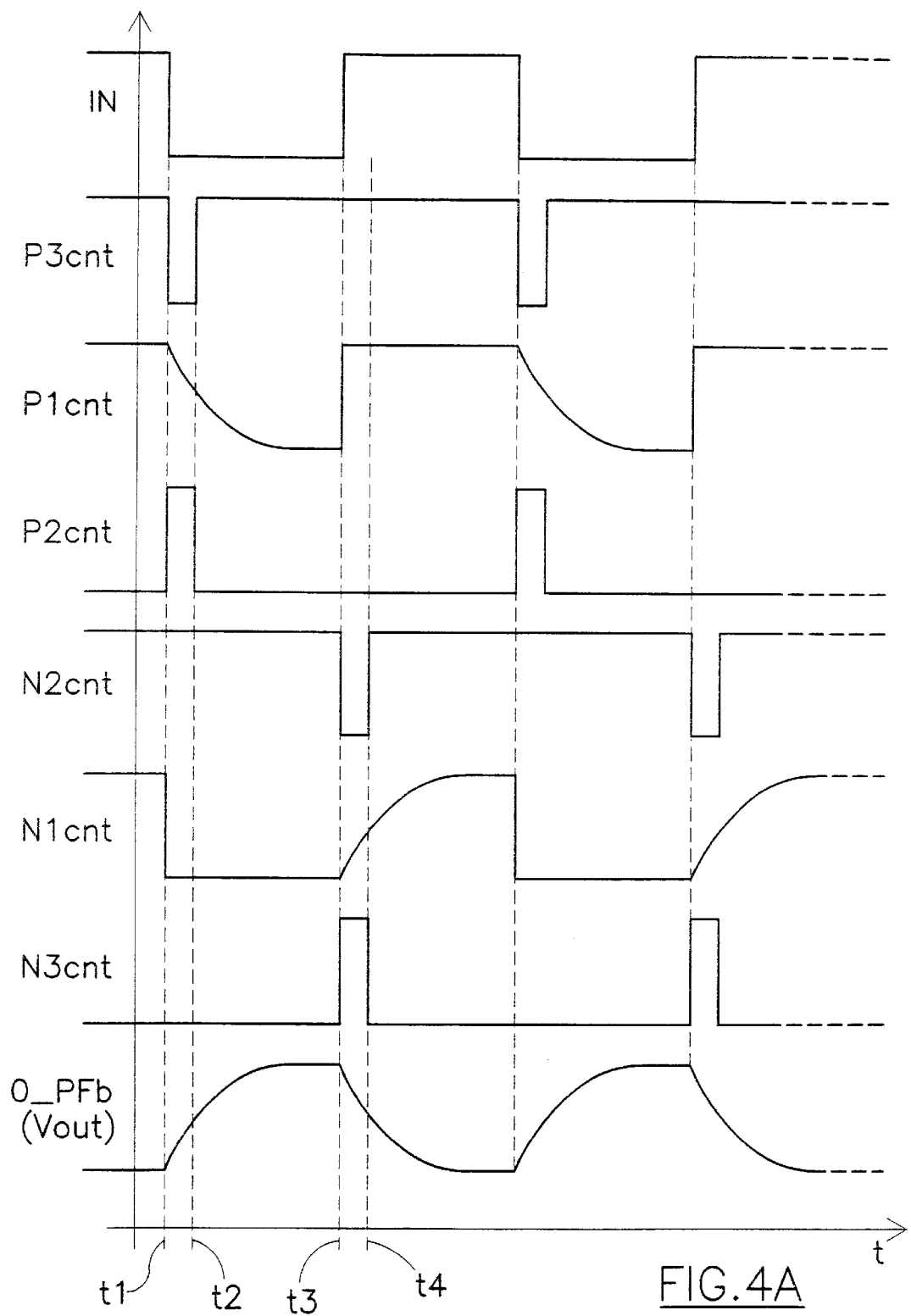
FIGS. 4A and 4B are time diagrams showing the operation of the output buffer of FIGS. 1, 2 and 3.
Figure 4B:
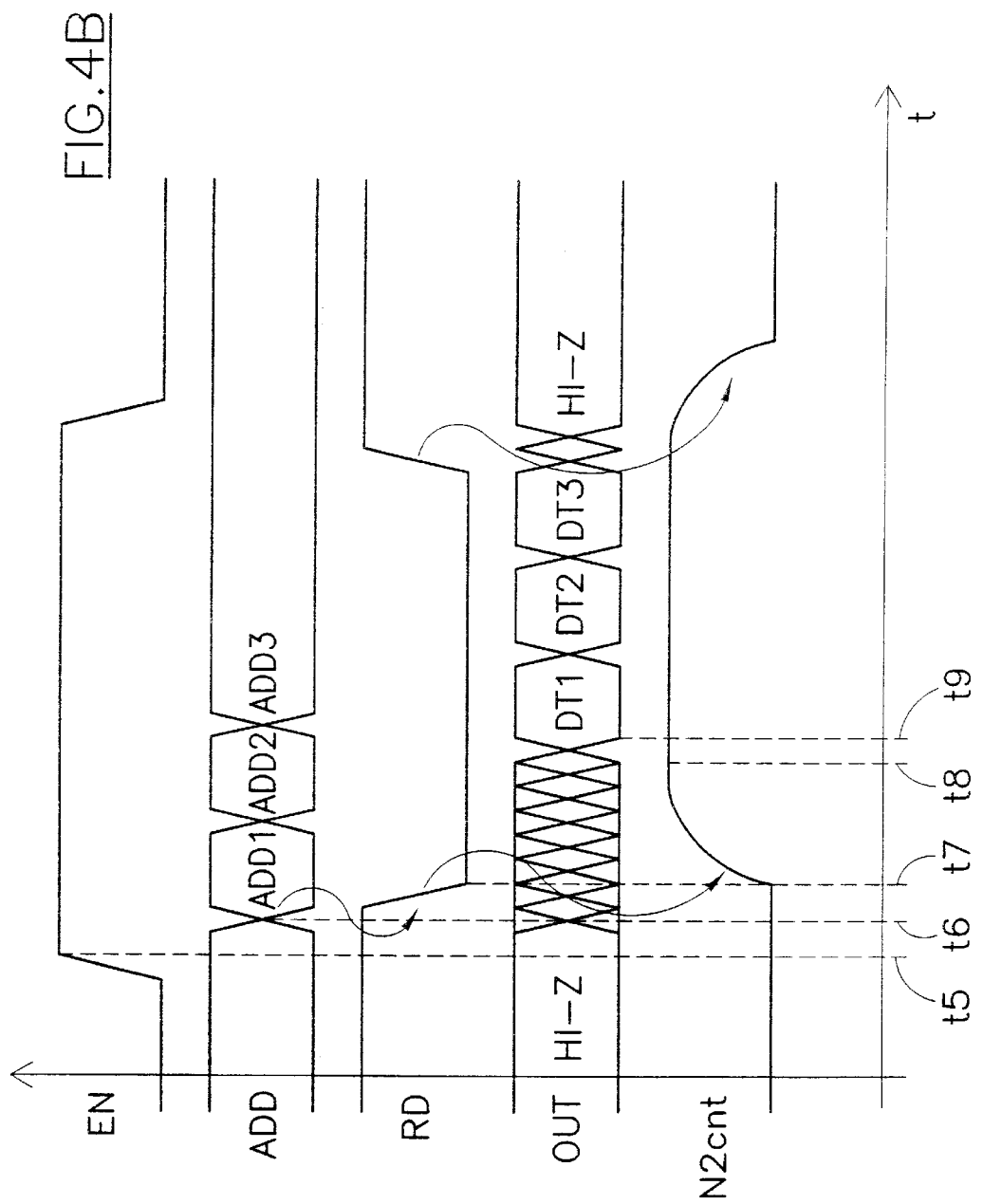

The operation of the output buffer described so far will be now explained making reference to the signal timing depicted in FIGS. 4A and 4B and to the partial circuit diagrams of FIGS. 5A to 5C and 6A to 6C. By way of example only, in the following discussion it will be assumed that the IC 103 is a memory device part of a more complex electronic system comprising for example a microprocessor.

Referring firstly to FIG. 4A, let it be assumed that the output enable signal OE, and thus the output buffer enable signal EN, are asserted, a condition corresponding to a logic "1" on signal EN (a voltage equal to the supply voltage VDD on such a signal); this means that the output buffer 107 is activated. Let it also be assumed that the control signal RD is asserted, a condition corresponding to a logic "0" (a voltage equal to the reference voltage GND), so that the inverter IV10 is activated, while the clamp MOSFET N4 is off. Starting from a condition in which the signal IN is a logic "1" the control signal P1cnt is a logic "1", and the control signal N1cnt is a logic "1". The pull-up transistor P1 of the final driver 109 is thus off, while the pull-down transistor N1 is on. The load capacitor Cload has therefore been discharged through the pull-down transistor N1, so that the voltage (Vout in FIG. 4) at the output signal pin OUT and at the output signal contact pad OUT_PAD is equal to the reference voltage GND, corresponding to a "0" logic state. In this condition, the control signals P2cnt and N2cnt are, respectively, a logic "0" and a logic "1". The first MOSFETs P2 and N2 of the first and second current switch circuits 111a and 111b are thus both on. On the contrary, the control signals P3cnt and N3cnt are, respectively, a logic "1" and a logic "0", so that the second MOSFETs P3 and N3 of the first and second current switch circuits 111a and 111b are both off. The situation is depicted in FIG. 5A for better clarity. A current Is flows from the voltage supply VDD to the reference voltage GND through the first transistors P2 and N2 of the two current switch circuits 111a, 111b. The value of the current Is depends on the dimensions of the first transistors P2 and N2 of the two current switch circuits.

Let it now be supposed that at the instant t1 the signal IN switches to the "0" logic state. The control signal N1cnt switches to the "0" logic state almost immediately (the NAND gate NA1 is fast in the "0"→"1" transition of the output thereof, and the inverter IV1 is dimensioned to speed-up such a transition), thus turning the pull-down transistor N1 of the final driver 109 off. The pull-up transistor P1 does not fully turn on immediately, because of the dimensioning of the three cascaded inverters IV2, IV3, IV4 which slows down the "1"→"0" transition of the control signal P1cnt. The "0"→"1" transition of the signal IN_Na in response to the switching of the signal IN causes the control signal P2cnt to switch from "0" to "1" and the control signal P3cnt to switch from "1" to "0" substantially simultaneously. In this way, the first MOSFET P2 of the first current switch circuit 111a is turned off, while the second MOSFET P3 is turned on almost simultaneously. In this condition, depicted in FIG. 5B, the current Is which flew from the supply voltage VDD to the reference voltage GND through the first MOSFETs P2 and N2 of the two current switch circuits 111a, 111b is deviated through the second MOSFET P3 of the first current switch circuit 111a, thus becoming a charge current Ic1 for the load capacitor Cload. The slow "1"→"0" transition of the control signal P1cnt slowly turns on the pull-up transistor P1 of the final driver 109, which starts to supply a charge current Ic2 to the load capacitor Cload. The charge current Ic2, initially very small, rises in time as the pull-up transistor P1 is progressively turned on.

As the load capacitor Cload is progressively charged by the charge currents Ic1 and Ic2, the voltage at the output signal pin OUT and thus at the output signal contact pad OUT_PAD rises. When the voltage at the output signal contact pad OUT_PAD, and thus the voltage of the feedback control signal O_Pfb, reaches a prescribed value (which is assumed to happen at instant t2 in FIG. 4), corresponding to the switching threshold of the inverters IV5 and IV9, the control signal P2cnt switches back to "0", and, substantially simultaneously, the control signal P3cnt switches back to "1". The second MOSFET P3 of the first current switch circuit 111a is thus turned off, while the first MOSFET P2 is turned on almost simultaneously. The current Is can again flow from the supply voltage VDD to the reference voltage GND through the first MOSFETs P2 and N2 of the two current switch circuits 111a and 111b. The situation is depicted in FIG. 5C: only the pull-up transistor P1 of the final driver 109 continues to supply the charge current Ic2 to the load capacitor Cload. In this way, the current delivered by the output buffer to the load capacitor reaches its maximum value smoothly, with a relatively low time derivative, thus avoiding causing voltage drops across the inductor Lvdd that would induce noise. The voltage at the output signal pin OUT raises asymptotically to the supply voltage VDD, and the charge current Ic2 falls to zero, while the current Is continues instead to flow.

A similar behaviour is experienced when the signal IN switches from "0" to "1". Starting from the situation depicted in FIG. 6A, which is the same as that shown in FIG. 5C, let it be assumed that at the instant t3 the signal IN undergoes a "0"→"1" transition. The control signal P1cnt switches to "1" almost immediately (the NOR gate NO1 is fast in the "1"→"0" transition of the output thereof, and the inverters IV2, IV3, IV4 are dimensioned to speed-up such a transition), thus turning the pull-up transistor P1 of the final driver 109 off. The pull-down transistor N1 turns on slowly, because of the dimensioning of the inverter IV1 which slows down the "0"→"1" transition of the control signal N1cnt. The "1"→"0" transition of the signal IN_Nb in response to the switching of the signal IN causes the control signal N2cnt to switch from "1" to "0" and the control signal N3cnt to switch from "0" to "1" substantially simultaneously. In this way, the first MOSFET N2 of the second current switch circuit 111b is turned off, while the second MOSFET N3 is turned on almost simultaneously. In this condition, depicted in FIG. 6B, the current Is which flew from the supply voltage VDD to the reference voltage GND through the first MOSFETs P2 and N2 of the two current switch circuits 111a, 111b is deviated through the second MOSFET N3 of the second current switch circuit 111b, thus becoming a discharge current Id1 for the load capacitor Cload. The pull-down MOSFET N1 contributes to the discharge current by means of a discharge current Id2, whose value is initially small but increases in time as the pull-down transistor N1 is progressively turned on.

As the load capacitor Cload is progressively discharged by the discharge currents Id1 and Id2, the voltage at the output signal pin OUT and thus at the output signal contact pad OUT_PAD falls. When the voltage at the output signal contact pad OUT PAD, and thus the voltage of the feedback control signal O_Pfb, reaches a prescribed value (which is assumed to happen at instant t4 in FIG. 4), corresponding to the switching threshold of the inverters IV5 and IV9, the control signal N2cnt switches back to "1", and, substantially simultaneously, the control signal N3cnt switches back to "0". The second MOSFET N3 of the second current switch circuit 111b is thus turned off, while the first MOSFET N2 is turned on almost simultaneously. The current Is can again flow from the supply voltage VDD to the reference voltage GND through the first MOSFETs P2 and N2 of the two current switch circuits 111a and 111b. The situation is depicted in FIG. 6C. The pull-down transistor N1 of the final driver 109 completes the discharge of the load capacitor Cload sinking the discharge current Id2. In this way, the current sunk by the output buffer from the load capacitor reaches its maximum value smoothly, with a relatively low time derivative, avoiding to cause voltage drops across the inductor Lvdd that would induce noise. The voltage at the output signal pin OUT falls asymptotically to the reference voltage GND, and the discharge current Id2 falls to zero, while the current Is continues instead to flow.

Preferably, the two inverters IV5, IV9 are dimensioned so that their switching threshold corresponds to a voltage for which the MOSFETs P3 and N3 leaves the saturation region. Thus, the MOSFETs P3 and N3 are kept on as far as they are in saturation, in this way assuring that a constant current flows through it.

It can be deduced that the output buffer has two distinct behaviours: initially, the output buffer turns rapidly on, starting a relatively strong charge or discharge of the load capacitor; as soon as the output voltage reaches a value considered safe, corresponding to a voltage for which the MOSFETs P3 and N3 leave the saturation region, the current switch circuits return in their initial condition, and the final driver completes the charge or discharge of the load capacitor.

The value of the current Is can be determined on a trade-off basis: from one side, such a current adds up to the current consumption of the integrated circuit, so it should be kept small; from the other side, the current Is should be sufficiently high to allow a fast charge or discharge of the load capacitor in the initial phase of a switching operation.

In any charge or discharge transient of the load capacitor, the output buffer has an active circuit part, actively taking part to the charge or discharge operation, and an inactive circuit part. For example, as shown in FIGS. 5A to 5C, the active circuit part during an operation of charge of the load capacitor includes the second P-channel MOSFET P3 of the first current switch circuit 111a and the pull-up transistor P1 of the final driver. It can be observed that the active circuit part of the output buffer is always isolated from the inactive circuit part, so that any possible noise generated by the inactive circuit part cannot affect the charge or discharge transient. In the cited example, the noise induced on the internal reference voltage line GNDint1 as a consequence of the sudden decrease of the current Is flowing through the parasitic inductor Lgnd does not affect the charge transient of the load capacitor. In addition to this, the circuit part of the output buffer that actively takes part to the charge or discharge transient is not subjected to significant changes in the current delivered, so that also the skin effect on the parasitic resistor is reduced.

The control circuit 113 carries on a precise and fast control of the turning on and off of the pairs of MOSFETs P2, P3 and N2, N3 of the two current switch circuits, ensuring that at least one MOSFET in each pair is always on. In this way, the current sunk from the package pin connected to the supply voltage VDD is kept substantially constant during a charge transient of the load capacitor Cload. Consequently, the time derivative of the current flowing through the parasitic inductor Lvdd, and thus the voltage drop across such an inductor, is kept small. Dually, the current delivered to the package pin connected to the reference voltage GND is kept substantially constant during a discharge transient of the load capacitor. The time derivative of the current flowing through the parasitic inductor Lgnd, and thus the voltage drop across such an inductor, is kept small.

It is important to note that the current switch circuits have a rejection action of the noise induced on the voltages on the internal supply voltage and reference voltage lines VDDint1 and GNDint1 by the parasitic components associated with the contact pads, the package leads and pins. Any noise on the voltage values of the internal supply voltage line VDDint1 or on reference voltage line GNDint1 causes a variation of the gate-source voltage of the MOSFET P3 or of the MOSFET N3 of the current switch circuits. The source potential of such MOSFETs varies in phase opposition with respect to the cause that has induced such a variation, thus tending to reduce the cause of the noise. For example, a decrease in the voltage value of the internal supply voltage line VDDint1 due to a voltage drop across the parasitic inductor Lvdd in consequence to an increase of the current flowing through the parasitic inductor Lvdd causes a decrease of the gate-to-source voltage of the P-channel MOSFET P3, which thus tends to reduce the current flowing through it and consequently to decrease the voltage drop across the parasitic inductor. This behaviour is typical of a negative feedback control loop.

The provision of the circuit block 301, selectively activating/deactivating the inverter IV10, has the function of cutting off the current Is when the output buffer is disabled (i.e., put in a high-impedance condition) or when, albeit enabled, the output buffer is not required to switch the output signal pin OUT, for example because the signal IN does not switch its state for a relatively long time. This is for example the case of a memory device IC which, albeit having the output buffers enabled, is not carrying out a read operation.

The activation transient of the output buffer 107 will be now explained referring to the timing diagram of FIG. 4B. Still considering the example of a memory device IC, as long as the microprocessor does not need to access the memory device IC 103, the output enable signal OE is kept de-asserted; consequently, the output buffer enable signal EN is also kept de-asserted (a condition corresponding to the "0" logic state). Referring back to FIG. 3A, a "0" logic state on the output buffer enable signal EN forces the control signals P1cnt and P3cnt to be logic "1"s, and the control signals N1cnt and N3cnt to be logic "0"s; the MOSFETs P1, N1, P3 and N3 are therefore all turned off, and the output buffer 107 is in a high-impedance, or disabled, state. Also, the control signal RD is de-asserted (a condition corresponding to a "1" logic state); referring back to FIG. 3B, the two P-channel MOSFETs P4 and P5 of the circuit block 301 are therefore turned off, so that the inverter is deactivated, and the clamp MOSFET N4 is turned on, so that the control signal N2cnt is a logic "0": the N-channel MOSFET N2 is thus turned off so that, albeit the P-channel MOSFET P2 is on, no current flows from the internal supply voltage line VDDint1 to the internal reference voltage line GNDint1. In other words, the output buffer 107 not only is in a high-impedance state, but it also sinks no current.

Let it now be assumed that the microprocessor needs to read the content of a memory location of the memory device IC 103. The output enable signal OE is thus asserted to signal to the IC 103 that the output buffer 107 can be activated. At the time instant t5, the IC circuitry 105 therefore asserts the output buffer enable signal EN by bringing it to the "1" logic level. This activates the output buffer 107, which leaves the high-impedance state: one of the MOSFETs of the final driver 109 is turned on according to the existing logic state of the signal IN, and the voltage of the output signal contact pad OUT_PAD is accordingly brought to the voltage of the internal supply voltage or reference voltage lines VDD_int1, GND_int1. As can be appreciated from the circuit schematics and from the preceding description, when the output buffer 107 is activated the logic state of the output signal contact pad is always opposite to the logic state of the signal IN. Clearly, the first transition of the output signal contact pad after the output buffer has been activated does not provide any valid output signal, since the existing state of the signal IN to which such a transition relates is not significant. The control signal RD is however still kept at the "1" state, so that no current still flow through the circuit branch formed by the MOSFETs P2 and N2.

At the time instant t6 the microprocessor sends to the memory device IC 103 an address ADD1 indicating the memory location to be accessed. The change in the address signals ADD is detected by the IC circuitry 105 (e.g., by conventional address transition detection circuits), which causes the control signal RD to be asserted (i.e., brought to the "0" state) at time instant t7. This causes the clamp MOSFET N4 to turn off and the P-channel MOSFET P4 to turn on; the inverter IV10 is thus enabled. Since in the meantime the output signal contact pad, and thus the feedback signal O_Pfb, have taken a logic state opposite to the current state of the signal IN, the output of the NOR gate NO2 is a logic "0", and the control signal N2cnt starts rising towards the voltage of the internal supply voltage line VDDint2. The rise is slow, due to the resistivity of the P-channel MOSFET P4. A current Is starts flowing from the internal supply voltage line VDDint1 to the internal reference voltage line GNDint1 through the MOSFETs P2 and N2. The N-channel MOSFET N2 is however not completely turned on until time instant t8 is reached. In this way, the current sunk by the output buffer increases smoothly from zero to a prescribed, static value, not to induce noise. The time interval between time instants t7 and t8 corresponds to the delay introduced by the delay line 303, which delays the turning on of the more conductive P-channel MOSFET P5. Such a delay can be determined taking into account the time necessary to the memory device IC to perform the first read operation. Put in different words, the fact that the memory device is not capable of providing the first output data DT1 in response to the address ADD1 before time instant t9 is advantageously exploited to slowly turn on the current switch circuits, thereby reaching the full value of the current Is with a low time derivative.

The subsequent read operations, corresponding to subsequent addresses ADD2, ADD3 sent by the microprocessor, are performed as described in connection with FIG. 4A. The output buffer outputs sequentially the data DT2 and DT3.

Let it be supposed that after the change of address from ADD2 to ADD3 the address does not change anymore. The circuitry 105 of the IC 103 detects this situation and de-asserts the control signal RD. The P-channel MOSFET P4 and the N-channel MOSFET N4 immediately turn off and on, respectively. The control signal N2cnt undergoes a slow "1"→"0" transition, which completes when, after the delay introduced by the delay line 303, also the P-channel MOSFET P5 turns off. In this way, the N-channel MOSFET N2 of the current switch circuit 111b slowly turns off, thereby cutting off the current Is.

Then, when the microprocessor so commands, the output buffer enable signal EN is de-asserted, and the output buffer is put again in a high-impedance condition.

In general, the control signal RD can be a signal which determines the cutting off of the static current Is sunk by the output buffer 107 when the latter, albeit enabled, is not requested to switch the output signal pin, for example because there are rather long dead times between two successive switches of the signal IN.

For example, let the case of a memory device featuring burst mode and/or page mode read capability be considered. When a burst or page mode read request is received, the memory device always takes a relatively long time to provide the first output data, while the subsequent data are provided faster. The time required by the memory device to provide the first output data can be advantageously exploited to slowly bring the current Is to the full, prescribed value.

The output buffer according to the present invention allows to have fast transitions on the output load: the current Is can in fact be deviated almost instantaneously to the output load, at the same time inducing a very low noise.

Thanks to this, it is not necessary to increase the number of contact pads so as to individually supplying each output buffer. This avoids an increase in the IC chip size and does not impose the use of dedicated packages with different pinouts compared to the standard ones.

The output buffer according to the present invention can be advantageously used in any type of integrated circuit, and particularly in those ICs, which, as the semiconductor memories, have a relatively high number of output signal lines.

Although the present invention has been disclosed and described by way of an embodiment thereof, it is apparent to those skilled in the art that several modifications to the described embodiment, as well as other embodiments of the present invention are possible without departing from the scope thereof as defined in the appended claims. The scope of the invention is not to be restricted, therefore, to the specific embodiment, and it is intended that the appended claims cover any and all such applications, modifications, and embodiments within the scope of the present invention.

For example, the current switch circuits may use other types of transistors or they may have a structure different from the one shown in FIG. 2.

Also, the final driver may have a different structure, and the output buffer control circuit may be implemented in a different way.

What is claimed is:

1. An output buffer for causing a voltage of an integrated circuit output line to switch between a voltage of a first voltage line to a voltage of a second voltage line, the output buffer comprising:

a current path switch circuit activatable for controlling a prescribed current to constantly flow between a first voltage line and a second voltage line during a time between two successive switchings of an output line;

wherein the current path switch circuit controls the prescribed current to be deviated to the output line during at least an initial phase of an output line switching between the first voltage line voltage to the second voltage line voltage, thereby keeping a substantially constant current flow between the first voltage line and the second voltage line during the output line switching.

2. The output buffer according to claim 1, wherein the current path switch circuit is deactivated if a time lapse between the two successive switchings of the output line exceeds a prescribed value.

3. The output buffer according to claim 1, wherein the current path switch circuit comprises three current paths selectively activatable in a mutually exclusive manner as follows:

a first current path causing the prescribed current to constantly flow between the first voltage line and the second voltage line during the time between two successive switchings of the output line;

a second current path causing, when activated, the prescribed current to be deviated to the output line during the initial phase of the output line switching from the second voltage line voltage to the first voltage line voltage, and a third current path causing the prescribed current to be deviated to the output line during the initial phase of the output line switching from the first voltage line voltage to the second voltage line voltage.

4. The output buffer according to claim 2, wherein the current path switch circuit comprises three current paths selectively activatable in a mutually exclusive manner as follows:

a first current path causing the prescribed current to constantly flow between the first voltage line and the second voltage line during the time between two successive switchings of the output line;

a second current path causing, when activated, the prescribed current to be deviated to the output line during the initial phase of the output line switching from the second voltage line voltage to the first voltage line voltage, and a third current path causing the prescribed current to be deviated to the output line during the initial phase of the output line switching from the first voltage line voltage to the second voltage line voltage.

5. The output buffer according to claim 3, in which the first current path comprises a first switch connected to the first voltage line and to a second switch connected in turn to the second voltage line, the second current path comprises a third switch connected between the first voltage line and the output line, and the third current path comprises a fourth switch connected between the output line and the second voltage line, the first and the third switches and the second and the fourth switches being activatable in a mutually exclusive manner.

6. The output buffer according to claim 4, in which the first current path comprises a first switch connected to the first voltage line and to a second switch connected in turn to the second voltage line, the second current path comprises a third switch connected between the first voltage line and the output line, and the third current path comprises a fourth switch connected between the output line and the second voltage line, the first and the third switches and the second and the fourth switches being activatable in a mutually exclusive manner.

7. The output buffer according to claim 5, in which the first, the second, the third and the fourth switches are transistors.

8. The output buffer according to claim 6, in which the first, the second, the third and the fourth switches are transistors.

9. The output buffer according to claim 7, in which the first and the third switches are first-conductivity-type-channel MOSFETs, and the second and the fourth switches are second-conductivity-type-channel MOSFETs.

10. The output buffer according to claim 8, in which the first and the third switches are first-conductivity-type-channel MOSFETs, and the second and the fourth switches are second-conductivity-type-channel MOSFETs.

11. The output buffer according to any one of claims 4, further comprising a final driver for completing the output line switching from one of the voltage of the first voltage line to the voltage of the second voltage line and vice-versa during a final phase of the output line switching.

12. The output buffer according to any one of claims 5, further comprising a final driver for completing the output line switching from the voltage of the first voltage line to the voltage of the second voltage line and vice-versa during a final phase of the output line switching.

13. The output buffer according to any one of claims 7, further comprising a final driver for completing the output line switching from the voltage of the first voltage line to the voltage of the second voltage line and vice-versa during a final phase of the output line switching.

14. The output buffer according to claim 11, in which the final driver is activated slowly, to keep small a time derivative of a current flowing through it.

15. The output buffer according to claim 12, in which the final driver is activated slowly, to keep small a time derivative of a current flowing through it.

16. The output buffer according to claim 13, in which the final driver is activated slowly, to keep small a time derivative of a current flowing through it.

17. The output buffer according to claim 11, in which the final driver comprises a first element for connecting the output line to the first voltage supply line and a second element for connecting the output line to the second voltage line.

18. The output buffer according to claim 14, in which the final driver comprises a first element for connecting the output line to the first voltage supply line and a second element for connecting the output line to the second voltage line.

19. A method of controlling the switching of an output line of an integrated circuit between a voltage of a first voltage line and a voltage of a second voltage line, the method comprising:

during a time between two successive switchings of an output line, causing a prescribed current to flow between a first voltage line and a second voltage line; and upon a switching of the output line, causing the prescribed current to be deviated to the output line for at least an initial phase of the switching;

thereby keeping a substantially constant current flow between the first voltage line and the second voltage line during the output line switching.

20. The method according to claim 19, further comprising cutting off the prescribed current if a time lapse between the two successive switchings of the output line exceeds a prescribed value.

* * * * *

UNITED STATES PATENT AND TRADEMARK OFFICE
CERTIFICATE OF CORRECTION

PATENT NO. : 6,737,886 B2
DATED : May 18, 2004
INVENTOR(S) : Giacomo Curatolo et al.

It is certified that error appears in the above-identified patent and that said Letters Patent is hereby corrected as shown below:

Title page,
Add the following Item:

[30]     Foreign Application Priority Data

Oct. 29, 2001    (EP) ..................... 01830675.3 --

Item [74], *Attorney, Agent or Firm*, change "Blanco" to -- Bianco --

Signed and Sealed this

Twentieth Day of July, 2004

JON W. DUDAS
*Acting Director of the United States Patent and Trademark Office*